US012411214B2

(12) United States Patent
Kakimoto et al.

(10) Patent No.: US 12,411,214 B2
(45) Date of Patent: Sep. 9, 2025

(54) LIMITED REFLECTION TYPE SENSOR

(71) Applicant: OMRON Corporation, Kyoto (JP)

(72) Inventors: Naoya Kakimoto, Ichinomiya (JP); Jun Nakajima, Ichinomiya (JP); Asuka Tada, Kyoto (JP)

(73) Assignee: OMRON Corporation, Kyoto (JP)

( * ) Notice: Subject to any disclaimer, the term of this patent is extended or adjusted under 35 U.S.C. 154(b) by 1103 days.

(21) Appl. No.: 16/979,222

(22) PCT Filed: Jan. 21, 2019

(86) PCT No.: PCT/JP2019/001583
§ 371 (c)(1),
(2) Date: Sep. 9, 2020

(87) PCT Pub. No.: WO2019/176284
PCT Pub. Date: Sep. 19, 2019

(65) Prior Publication Data
US 2020/0400786 A1 Dec. 24, 2020

(30) Foreign Application Priority Data
Mar. 13, 2018 (JP) .................. 2018-045443

(51) Int. Cl.
*G01S 7/48* (2006.01)
*G01S 7/481* (2006.01)
(Continued)

(52) U.S. Cl.
CPC .......... *G01S 7/4813* (2013.01); *H05K 5/0221* (2013.01); *H05K 5/0247* (2013.01); *H05K 5/03* (2013.01)

(58) Field of Classification Search
None
See application file for complete search history.

(56) References Cited

U.S. PATENT DOCUMENTS

2003/0036702 A1 *  2/2003  Davidsen ............. A61B 8/4411
                                                            600/437
2010/0258711 A1   10/2010  Wang et al.
(Continued)

FOREIGN PATENT DOCUMENTS

AU    2013365265 A1 *  4/2015  ............... B60J 5/00
CN    102565802 A      7/2012
(Continued)

OTHER PUBLICATIONS

English translation of the International Search Report ("ISR") of PCT/JP2019/001583 mailed on Apr. 9, 2019.
(Continued)

*Primary Examiner* — Hovhannes Baghdasaryan
(74) *Attorney, Agent, or Firm* — METROLEX IP LAW GROUP, PLLC; Robert L. Scott, Esq.

(57) ABSTRACT

A limited reflection type sensor which irradiates exit light from a light emitting unit toward an object sensing region through an exit light lens and receives, at a light receiving unit, reflected light from an object existing in the object sensing region through a reflected light lens, may include a casing including a latching portion formed on a side surface and a first opening facing the object sensing region, the casing accommodating the light emitting unit and the light receiving unit; and a lens part including a light incident/exit part formed integrally with the exit light lens and the reflected light lens, and a side surface covering part in which an end of the light incident/exit part is extended along the side surface, in which the lens part covers the first opening with the light incident/exit part and the side surface covering part is latched by the latching portion.

19 Claims, 13 Drawing Sheets

(51) Int. Cl.
    *H05K 5/02*     (2006.01)
    *H05K 5/03*     (2006.01)

(56) References Cited

U.S. PATENT DOCUMENTS

2015/0108332 A1     4/2015   Murota et al.
2015/0331106 A1    11/2015   Okada

FOREIGN PATENT DOCUMENTS

| | | |
|---|---|---|
| CN | 104798213 A | 7/2015 |
| JP | S58-125335 U | 8/1983 |
| JP | S59-061445 U | 4/1984 |
| JP | S59-088843 U | 6/1984 |
| JP | 2010066136 A | 3/2010 |
| JP | 2015-81801 A | 4/2015 |

OTHER PUBLICATIONS

Written Opinion("WO") of PCT/JP2019/001583 mailed on Apr. 9, 2019.
Office Action (CNOA) issued on Nov. 30, 2023 in a counterpart Chinese patent application, with English translation.

\* cited by examiner

100

(a)

A-A (b)

B-B (a)

(b)

(a) A-A (b) B-B

LIMITED REFLECTION TYPE SENSOR

TECHNICAL FIELD

The present invention relates to a sensor, and in particular, relates to a limited reflection type sensor which irradiates exit light from a light emitting unit toward an object sensing region through an exit light lens and receives, at a light receiving unit, reflected light from an object existing in the object sensing region through a reflected light lens.

BACKGROUND ART

Conventionally, as a sensor for detecting whether or not an object exists at a predetermined position, there has been proposed a limited reflection type sensor which irradiates exit light from the light emitting unit to a limited sensing region of an object, and receives, at the light receiving unit, reflected light reflected by the object in the sensing region (see Patent Document 1, for example).

Such limited reflection type sensor irradiates exit light from the light emitting unit to the sensing region through the exit light lens, and receives, at the light receiving unit, reflected light reflected by an object in the sensing region through the receiving light lens. When reflected light enters the light receiving unit, the light is converted into an electric signal by the light receiving unit, and hence the presence of an object in the sensing region can be sensed by detecting a voltage change occurring in the light receiving unit. Therefore, the sensing region is limited to a range in which light is irradiated from the light emitting unit and the light can reach the light receiving unit. The setting range of such sensing region can be changed by the optical design of the exit light lens and the receiving light lens.

In the limited reflection type sensor of the prior art shown in Patent Document 1, each of the exit light lens and the receiving light lens is configured by a combination of an aspherical lens and a cylindrical lens. Due to this, by sensing a short distance using the cylindrical lens and sensing a long distance using the aspherical lens, it is possible to expand the long distance sensing range while maintaining the short distance sensing range.

PRIOR ART DOCUMENTS

Patent Document

Patent Document 1: Japanese Unexamined Patent Publication No. 2015-81801

SUMMARY OF THE INVENTION

Problems to be Solved by the Invention

In the conventional limited reflection type sensor described above, it is necessary to accommodate the exit light lens and the receiving light lens in the casing and to accurately perform focus position alignment with the light emitting unit and the light receiving unit, respectively. Therefore, a projection and a hole are integrally formed at the end and a center of the lens, and fitted into corresponding latching portions in the casing, thereby performing alignment. By assembling lenses with different focus positions, it is possible to change the sensing range of the limited reflection type sensor to one corresponding to the lens.

However, when accommodating the lens in the casing, it is necessary to insert the lens into the casing in a state where the lens is held and to perform alignment to the latching portion, and hence there has been a problem that the assembly process becomes complicated. Since it is necessary to integrally form a projection and a hole for alignment on the lens, the shape of the lens becomes complicated and the difficulty level of processing becomes high. Furthermore, after aligning the lens in the casing, it is necessary to cover the casing upper portion with a lid to prevent dust and dirt from entering inside the casing. Thus, in a state where the lid is mounted, it has been difficult to check whether or not the lens corresponding to the sensing range is assembled, whether or not the lens is accurately aligned, and the like.

The present invention has been devised to solve such problems, and its object is to provide a limited reflection type sensor capable of easily and accurately performing alignment at the time of mounting a lens, and capable of enhancing the dust-resistant property.

Means for Solving the Problem

In order to solve the above problems, the limited reflection type sensor of the present invention is a limited reflection type sensor limited reflection type sensor which irradiates exit light from a light emitting unit toward an object sensing region through an exit light lens and receives, at a light receiving unit, reflected light from an object existing in the object sensing region through a reflected light lens, the limited reflection type sensor having a casing including a latching portion formed on a side surface and a first opening facing the object sensing region, the casing accommodating the light emitting unit and the light receiving unit, and a lens part including a light incident/exit part formed integrally with the exit light lens and the reflected light lens, and a side surface covering part in which an end of the light incident/exit part is extended along the side surface, in which the lens part covers the first opening with the light incident/exit part, and the side surface covering part is latched by the latching portion.

Due to this, the side surface covering part extended from the light incident/exit part is latched by the latching portion formed on the side surface of the casing, and it becomes possible to easily and accurately perform alignment at the time of mounting the lens, and possible to enhance the dust-resistant property.

In one aspect of the present invention, the latching portion has a snap-fit structure in which a latching pawl is formed at the tip of an elastic piece, and the latching pawl is fitted into a latching opening formed on the side surface covering part.

In one aspect of the present invention, a guide groove guiding the side surface covering part is formed on the side surface.

In one aspect of the present invention, the latching portion latches the side surface covering part at a position closer to the light incident/exit part relative to half in the extension direction of the side surface covering part.

In one aspect of the present invention, the first opening includes a sealing groove inside, the sealing groove being formed along the longitudinal direction of the casing, the lens part includes a sealing projection having a shape corresponding to the sealing groove formed on the first opening side, and the sealing groove and the sealing projection abut against each other.

In one aspect of the present invention, the casing includes a second opening on the side opposite to the first opening, and the limited reflection type sensor further has a mounting substrate accommodated in the casing with the light emitting unit and the light receiving unit mounted thereon, and a cover latched to the casing and covering the second opening.

In one aspect of the present invention, a connector for external electrical connection is mounted on the mounting substrate, and the connector is exposed from a third opening formed on another side surface of the casing.

In one aspect of the present invention, the connector is exposed from a fourth opening formed on the bottom surface of the cover.

Effect of the Invention

According to the present invention, it is possible to provide a limited reflection type sensor capable of performing accurate alignment at the time of mounting a lens, and capable of enhancing the dust-resistant property.

BRIEF DESCRIPTION OF THE DRAWINGS

FIG. 6(a) is a schematic cross-sectional view at a position A-A in FIG. 1, and FIG. 6(b) is a schematic cross-sectional view at a position B-B in FIG. 1.

FIG. 7(a) shows an example using a press-fitting pin 19a and a swaging pin 19b, and FIG. 7(b) shows an example in which a bonding agent 19c is applied to a rear surface of the mounting substrate 31.

FIG. 13(a) is a schematic cross-sectional view at a position A-A in FIG. 8, and FIG. 13(b) is a schematic cross-sectional view at a position B-B in FIG. 8.

MODE FOR CARRYING OUT THE INVENTION

First Embodiment

Figure 1:
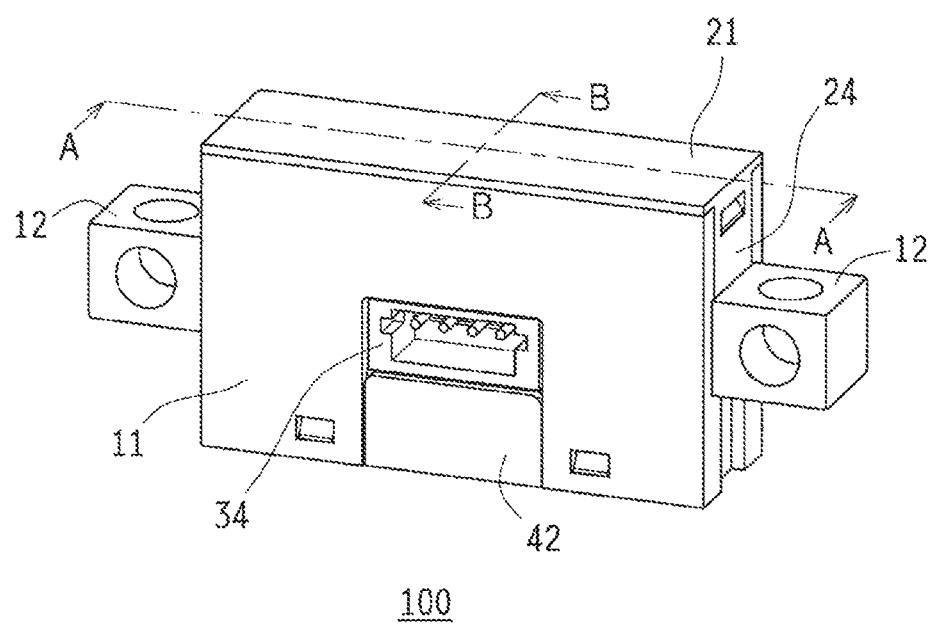
FIG. 1 is a schematic perspective view showing a configuration of a limited reflection type sensor 100 according to a first embodiment.
Figure 2:
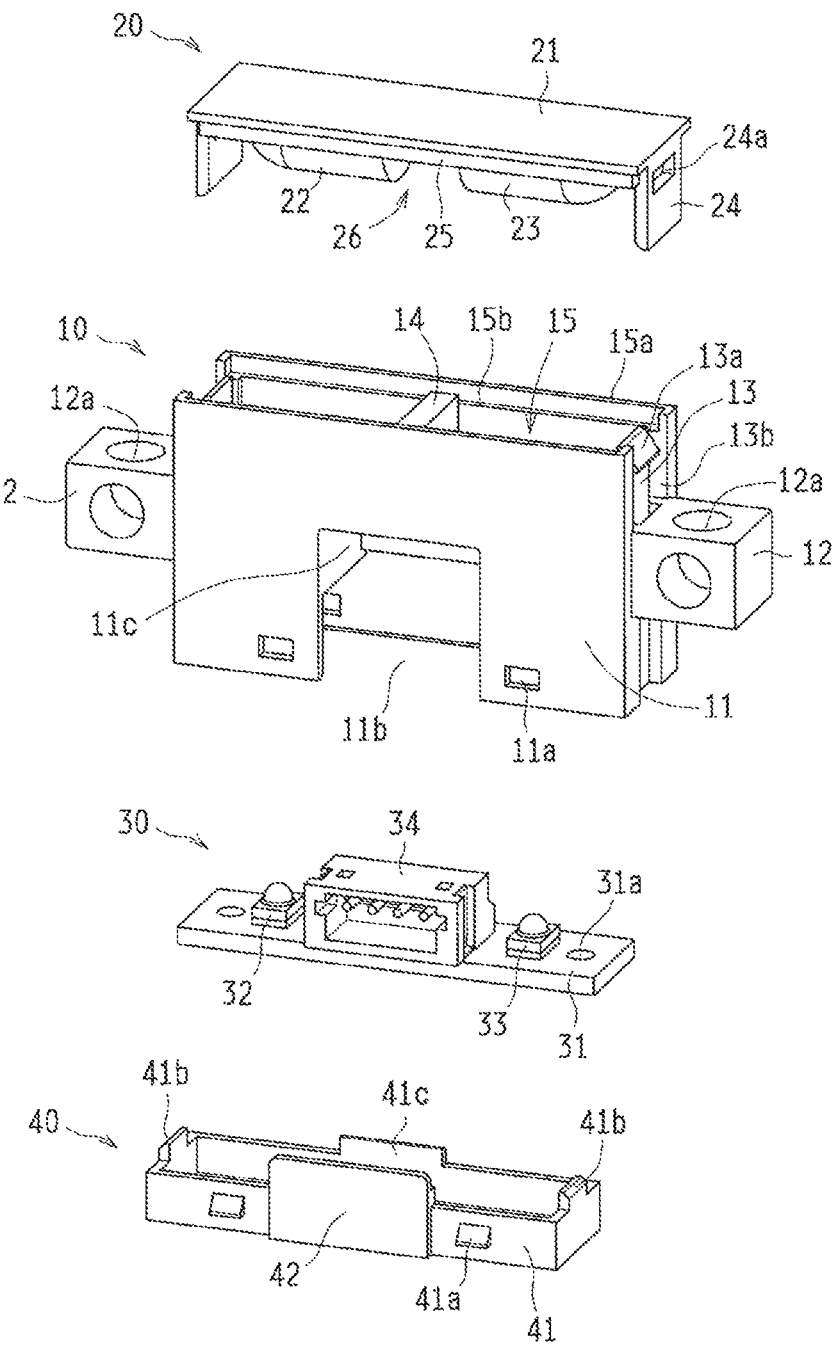
FIG. 2 is an exploded perspective view schematically showing the configuration of the limited reflection type sensor 100.

The first embodiment of the present invention will be described below with reference to the drawings. FIG. 1 is a schematic perspective view showing the configuration of the limited reflection type sensor 100 according to the first embodiment. FIG. 2 is an exploded perspective view schematically showing the configuration of the limited reflection type sensor 100. As shown in FIGS. 1 and 2, the limited reflection type sensor 100 includes the casing 10, the lens part 20, the substrate 30, and the cover 40.

The casing 10 is a casing forming an outer shape of the limited reflection type sensor 100 and holding each component, and FIG. 1 shows a box-shaped example of a substantially rectangular parallelepiped. The casing 10 is made of a material that does not transmit light having a wavelength longer than that of ultraviolet light, and for example, a black colored resin can be used. The casing 10 includes a casing body 11, an attachment portion 12, a latching portion 13, a partition plate 14, and an opening 15. The shape of the casing 10 is not limited to the rectangular parallelepiped shape shown in FIG. 1.

In the casing body 11, a latching opening 11a is formed in the vicinity of the bottom surface of the side surface, a bottom opening 11b is formed on the bottom surface, and a side surface opening 11c is formed in the longitudinal side surface each as an opening. The attachment portion 12 and the latching portion 13 are formed on the side surface of the short side, the opening 15 is formed on the upper surface, and the partition plate 14 is provided in the opening 15.

The latching opening 11a is an opening formed on the side surface of the casing body 11 and is formed at a position corresponding to a latching pawl 41a described later. Although FIGS. 1 and 2 show an example in which the latching opening 11a is provided in the longitudinal direction of the casing 10, the latching opening 11a may be provided on the bottom surface in the short side direction. The bottom surface opening 11b is an opening formed on the lower surface of the casing body 11, and corresponds to the second opening in the present invention. The side surface opening 11c is an opening formed on the side surface of the casing body 11, and corresponds to the third opening in the present invention. The side surface opening 11c is formed at a position and in a shape corresponding to a connector 34 and an opening covering part 42 described later.

The attachment portion 12 is a portion formed integrally with the casing body 11 on the short side surface of the casing 10, and is a portion for aligning and fixing the limited reflection type sensor 100 to another member. FIGS. 1 and 2 show an example in which the attachment portion 12 is a projection having a substantially cubic shape, and an attachment hole 12a, which is a hole penetrating in the vertical direction and the depth direction, is formed. The attachment hole 12a is a hole into which a fixing member such as a screw or a bolt is inserted, and a screw groove may be formed inside thereof as necessary. The shape of the attachment portion 12 is not limited to that shown in FIGS. 1 and 2, and, for example, a flat plate formed to protrude substantially horizontally from the side surface may be used.

The latching portion 13 is a portion formed on the side surface of the short side of the casing body 11, and for latching the lens part 20. Although the specific structure of the latching portion 13 is not limited, it is possible to use a snap-fit structure in which a part of the side surface is cut out as an elastic piece and a latching pawl 13a is formed at the tip thereof as shown in FIGS. 1 and 2, for example. In the latching portion 13, a guide groove 13b having the same width and length as those of a side surface covering part 24 described later is formed in the short side surface of the casing body 11.

The partition plate 14 is a substantially flat plate portion erected at the substantially center of the opening 15. The partition plate 14 divides the light emitting side and the light receiving side, and its upper end abuts against the lower surface of a light incident/exit part 21 of the lens part 20 described later. Since the light receiving side and the light emitting side are divided by the partition plate 14, it can prevent light from directly reaching from a light emitting unit 32 to a light receiving unit 33.

The opening 15 is an opening formed on the upper surface of the casing body 11, and corresponds to the first opening in the present invention. A lens abutting portion 15a and a sealing groove 15b are formed in the opening 15. The lens abutting portion 15a is a portion forming an upper end of a longitudinal side surface of the casing body 11. The sealing groove 15b is a step or groove formed inside the lens abutting portion 15a and is formed to a position lower than the upper end of the partition plate 14. The shape of the sealing groove 15b is formed to have a width, a length, and a depth corresponding to a sealing projection 25 of the lens part 20 described later. While in FIG. 2, the sealing groove 15b is extended to the outside relative to the elastic piece of the latching portion 13, it may have a shape extending to the inside of the elastic piece in order to prevent erroneous insertion of the side surface covering part 24.

The lens part 20 is an optical member that is made of a translucent material such as resin, that transmits light exit from the light emitting unit 32 and takes it out to the outside with a predetermined light distribution, and that transmits light incident from the outside and causes it to enter the light receiving unit 33. As shown in FIGS. 1 and 2, the lens part 20 includes the light incident/exit part 21, an exit light lens 22, a reflected light lens 23, the side surface covering part 24, and the sealing projection 25.

The light incident/exit part 21 is a substantially flat plate portion forming the upper portion of the lens part 20, and the exit light lens 22 and the reflected light lens 23 are integrally formed on the lower surface side thereof. The upper surface of the light incident/exit part 21 is a substantially flat surface, and is arranged opposite to the object sensing region. Accordingly, the limited reflection type sensor 100 performs light emission to the object sensing region and light reception from the object sensing region via the light incident/exit part 21. Since the lens part 20 has the light incident/exit part 21, the lens part 20 does not protrude to the outside of the limited reflection type sensor 100, and it is possible to save space and suppress adhesion of dirt. The outer peripheral vicinity of the light incident/exit part 21 is formed to be approximately equal to the outer diameter of the lens abutting portion 15a of the casing body 11, and abuts against the lens abutting portion 15a to align and fix the lens part 20 to the casing 10.

The exit light lens 22 is a lens for irradiating the object sensing region with light exit from the light emitting unit 32. The reflected light lens 23 is a lens for causing light reflected by the sensing target in the object sensing region to enter the light receiving unit 33. The exit light lens 22 and the reflected light lens 23 are formed at positions separated from each other by a separation groove 26, and the lens part 20 is molded integrally with the light incident/exit part 21. By integrally molding the exit light lens 22 and the reflected light lens 23 as the lens part 20, with simply aligning the lens part 20 to the casing 10, it is possible to align the exit light lens 22 and the reflected light lens 23 to the light emitting unit 32 and the light receiving unit 33, respectively, and it is possible to simplify the assembly process and improve alignment accuracy.

The side surface covering part 24 is a flat plate-like portion in which both ends of the light incident/exit part 21 are extended downward in the figure, and is molded integrally with the light incident/exit part 21. The shape of the side surface covering part 24 is formed to have the same width and length as those of the guide groove 13b. A latching opening 24a is formed in the side surface covering part 24 at a position corresponding to the latching portion 13. When the lens part 20 is attached to the casing 10, the side surface covering part 24 is fitted into the guide groove 13b, and the latching portion 13 is fitted into the latching opening 24a, thereby performing alignment and fixing.

The sealing projection 25 is a linear projection provided on the rear surface side in the vicinity of the long side of the light incident/exit part 21, and is formed in a position and shape corresponding to the sealing groove 15b. As shown in FIG. 2, the longitudinal end of the sealing projection 25 is positioned outside relative to the inner surface of the side surface covering part 24 and positioned inside relative to the outer surface.

The separation groove 26 is a groove separating between the exit light lens 22 and the reflected light lens 23 and reaching the rear surface of the light incident/exit part 21, and aligns and holds the lens part 20 by inserting the partition plate 14. Of the exit light lens 22 and the reflected light lens 23, the surface exposed by the separation groove 26 has a tapered shape, thereby facilitating insertion and alignment of the partition plate 14.

The substrate 30 is a member in which the light emitting unit 32, the light receiving unit 33, and the connector 34 are mounted on one surface of the mounting substrate 31. The mounting substrate 31 is a substrate on which a wiring layer (not shown) is formed, and the light emitting unit 32, the light receiving unit 33, and the connector 34 are mounted on the wiring layer. The material forming the mounting substrate 31 is not limited, and it is possible to use known materials such as a printed circuit board, a metal substrate, and a composite substrate of resin and metal. An aligning hole 31a, which is a through hole, is formed on the mounting substrate 31 at a predetermined position.

The light emitting unit 32 is a member to which power and a signal are transmitted from the outside of the limited reflection type sensor 100 via the connector 34 and the wiring layer, and which emits light with a predetermined wavelength. Although the specific configuration of the light emitting unit 32 is not limited, a light emitting diode (LED) or the like is used. The wavelength of the light emitted by the light emitting unit 32 only needs to be included in the absorption band of the light receiving unit 33, and for example, infrared light is used. The light emitting unit 32 may include an optical member such as a lens, and irradiates, with light emitting from an LED chip, the light having a desired light distribution characteristic.

The light receiving unit 33 is a member that absorbs light of a predetermined wavelength, converts the light into an electric signal, and sends a detection signal to the outside of the limited reflection type sensor 100 via the connector 34 and the wiring layer. Although the specific configuration of the light receiving unit 33 is not limited, for example, a phototransistor can be used. The light receiving unit 33 includes a wavelength of light irradiated by the light emitting unit 32 in an absorption band. The light receiving unit 33 may include an optical member such as a lens, and efficiently collects incident light to a phototransistor for detection.

The connector 34 is a member to which a harness or the like is connected from the outside of the limited reflection type sensor 100 and an output and a signal from the outside are transmitted. The terminal of the connector 34 is electrically connected to the wiring layer on the mounting substrate 31. In the examples shown in FIGS. 1 and 2, the connector 34 is mounted in a direction parallel to the mounting surface of the mounting substrate 31, and is exposed to the outside of the casing 10 from the side surface opening 11c.

The cover 40 is a member that covers the bottom surface opening 11b of the casing 10 and holds the substrate 30. The cover 40 has a cover wall 41 erected along the four sides of the bottom surface outer periphery, and the outer periphery of the cover wall 41 is substantially identical to the inner periphery of the bottom surface opening 11b. The latching pawl 41a is formed protruding on the side surface of the cover wall 41, and substrate supports 41b and 41c are formed protruding upward at the upper end of the cover wall 41. At a position corresponding to the side surface opening 11c, the opening covering part 42 is formed to a position higher than the substrate supports 41b and 41c.

In the limited reflection type sensor 100 shown in FIGS. 1 and 2, the power and the signal supplied to the connector 34 from the outside are transmitted to the light emitting unit 32, and the light emitting unit 32 emits light. The light from the light emitting unit 32 is incident on the exit light lens 22, and the light is irradiated to the outside through the light incident/exit part 21 with a light distribution corresponding to the curved surface of the exit light lens 22. When an object is present in the object sensing region for sensing the object, the light irradiated from the light emitting unit 32 is reflected in the limited reflection type sensor 100 direction, enters the reflected light lens 23 via the light incident/exit part 21, and enters the light receiving unit 33. The light receiving unit 33 outputs a voltage corresponding to the intensity of the received light, and the voltage value is transmitted to the outside via the connector 34 as a signal for sensing an object.

Figure 3:
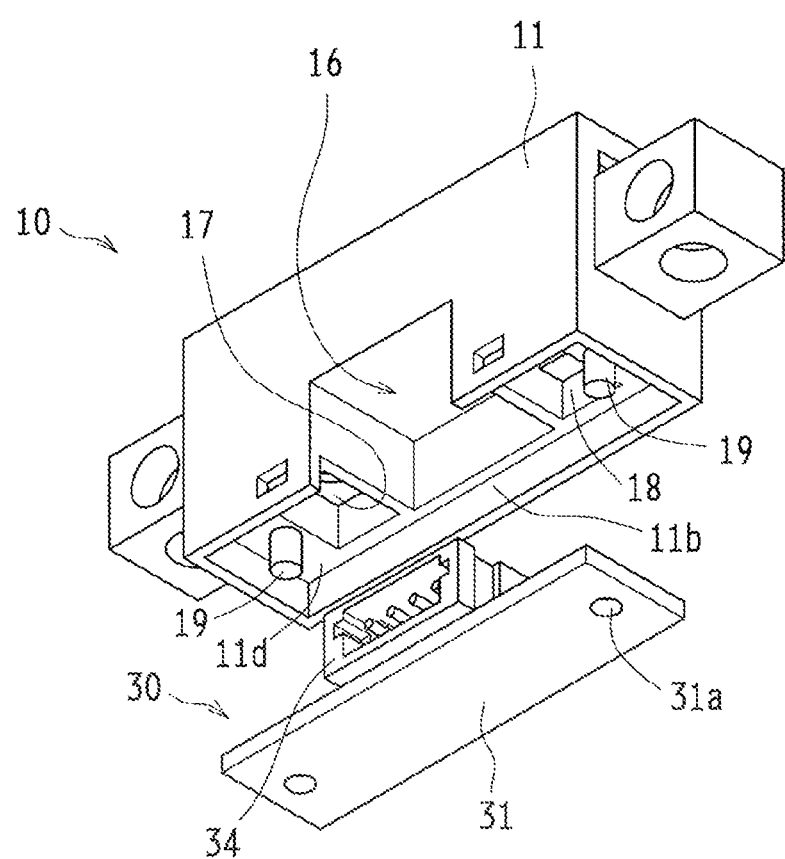
FIG. 3 is a schematic perspective view for explaining assembly of a casing 10 and a substrate 30.

Next, assembly of the limited reflection type sensor 100 will be described with reference to FIGS. 3 to 5. FIG. 3 is a schematic perspective view for explaining assembly of the casing 10 and the substrate 30. As shown in FIG. 3, a division wall 11d is formed in the casing 10. The division wall 11d forms a connector accommodation 16, a light emitting accommodation 17, and a light receiving accommodation 18 inside the casing 10. A projection downward from the division wall 11d is formed as a substrate aligning part 19.

The connector accommodation 16 is a space formed inside the casing body 11 from the side surface opening 11c, and accommodating the connector 34. The connector accommodation 16 is divided from the light emitting accommodation 17 and the light receiving accommodation 18 by the division wall 11d, and is also divided from the space accommodating the exit light lens 22 and the reflected light lens 23 by the division wall 11d on the opening 15 side.

The light emitting accommodation 17 is a space provided in communication with the opening 15, and is further in communication with the bottom surface opening 11b of the casing body 11. The light emitting unit 32 is arranged at a predetermined position in the light emitting accommodation 17. The light receiving accommodation 18 is a space provided in communication with the opening 15, and is further in communication with the bottom surface opening 11b of the casing body 11. The light receiving unit 33 is arranged at a predetermined position in the light receiving accommodation 18. The substrate aligning part 19 is a projection formed at a position corresponding to the aligning hole 31a formed on the mounting substrate 31.

As shown in FIG. 3, the substrate aligning part 19 and the aligning hole 31a are aligned, the connector accommodation 16 and the connector 34 are aligned, and the substrate 30 is inserted into the bottom surface opening 11b. Due to this, the light emitting unit 32 is aligned at a predetermined position of the light emitting accommodation 17, and the light receiving unit 33 is aligned at a predetermined position of the light receiving accommodation 18.

In the embodiment, the side surface opening 11c is formed on the casing 10, and the connector 34 is accommodated in the connector accommodation 16 and exposed from the side surface opening 11c. As described above, since the connector accommodation 16 is divided from the light emitting accommodation 17 and the light receiving accommodation 18 by the wall surface, even if the connector 34 is exposed to the outside, it is possible to suppress entry of dust and dirt from the outside into the light emitting accommodation 17 and the light receiving accommodation 18, and it is possible to enhance the dust-resistant property. With only alignment of the aligning hole 31a and the substrate aligning part 19, it is possible to easily and accurately align the light emitting unit 32 and the light receiving unit 33 at predetermined positions.

Figure 4:
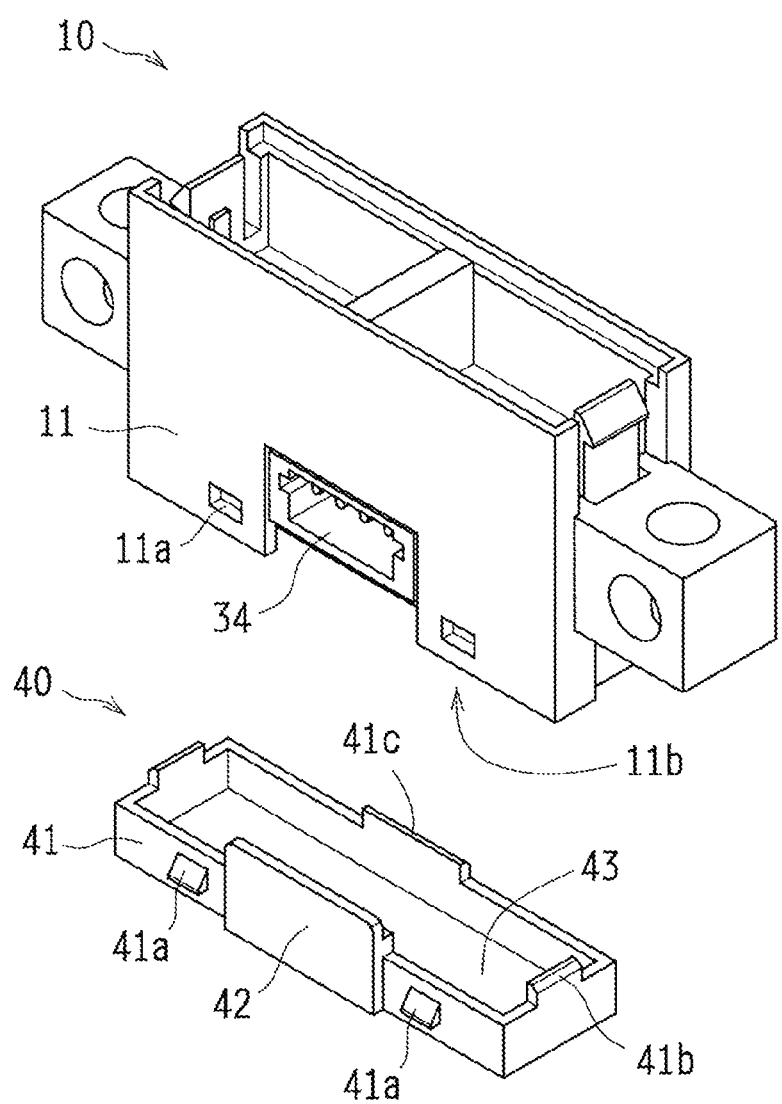
FIG. 4 is a schematic perspective view for explaining assembly of the casing 10 and a cover 40.

FIG. 4 is a schematic perspective view for explaining assembly of the casing 10 and the cover 40. As shown in FIG. 4, a substantially flat plate bottom surface 43 is formed at the bottom of the cover 40, and the cover wall 41 is provided along the outer edge of the bottom surface 43. When the cover 40 is inserted into the bottom surface opening 11b of the casing 10, the outer periphery of the cover wall 41 is fitted into the inner wall of the casing body 11, and the latching pawl 41a is fitted into the latching opening 11a, whereby the cover 40 is aligned and fixed. At this time, the substrate supports 41b and 41c formed at the upper end of the cover wall 41 support the rear surface side of the mounting substrate 31, and the opening covering part 42 supports the lower surface side of the connector 34. Due to this, the substrate 30 aligned inside the casing 10 is sandwiched between the cover 40 and the casing 10, and is aligned and fixed.

The opening covering part 42 is formed in a size covering a region of the side surface opening 11c other than the region where the connector 34 is exposed, and the side surface opening 11c can be covered with the opening covering part 42 at the same time the bottom surface opening 11b is covered with the cover 40. Due to this, the substrate 30 can be easily fixed with the cover 40, and it is possible to suppress entry of dust and dirt from the outside and it is possible to enhance dust-resistant property.

Figure 5:
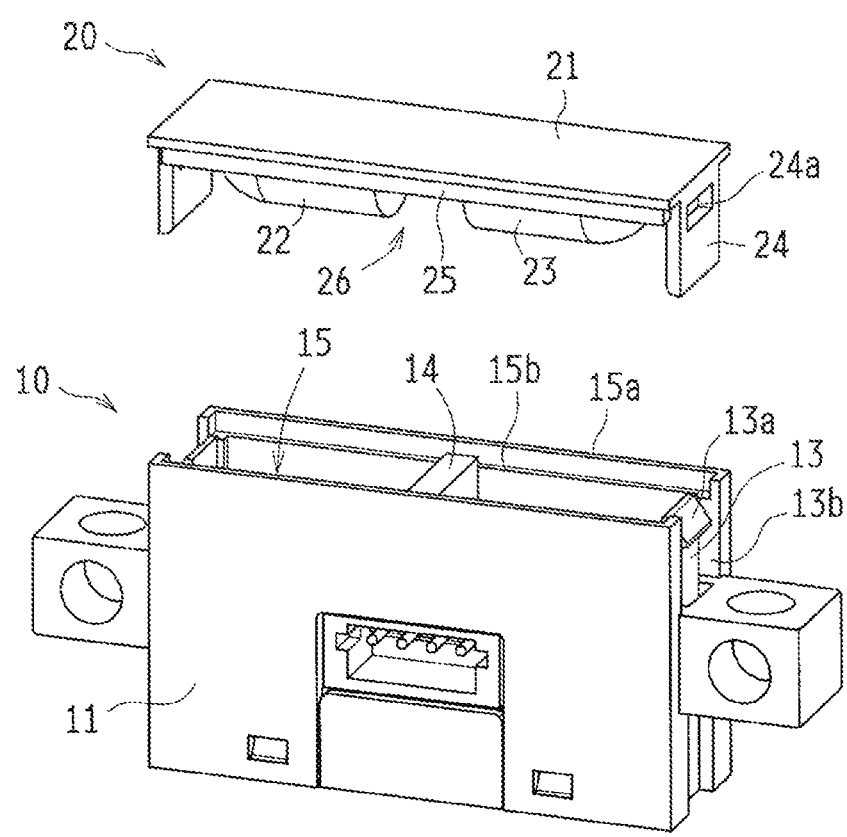
FIG. 5 is a schematic perspective view for explaining assembly of the casing 10 and a lens part 20.

FIG. 5 is a schematic perspective view for explaining assembly of the casing 10 and the lens part 20. As shown in FIG. 5, the side surface covering part 24 of the lens part 20 is aligned to the latching portion 13 of the casing 10, and the opening 15 is covered with the light incident/exit part 21 of the lens part 20. At this time, at the same time, the partition plate 14 is inserted into the separation groove 26 and abuts against the rear surface of the light incident/exit part 21, and the sealing projection 25 is inserted into the sealing groove 15b. The side surface covering part 24 is fitted into the guide groove 13b, and the latching pawl 13a is fitted into the latching opening 24a, whereby the lens part 20 is aligned and fixed to the casing 10.

Figure 6:
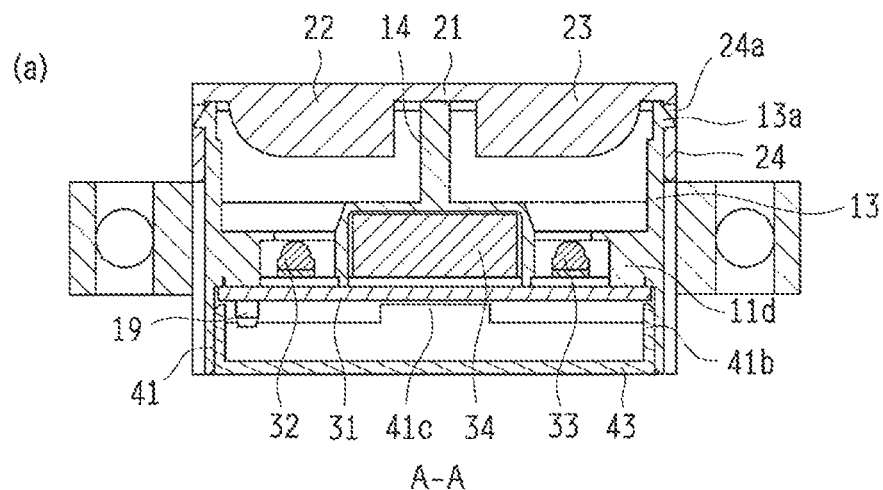
FIGS. 6(a) and 6(b) are cross-sectional views of the limited reflection type sensor 100, where
Figure 6:
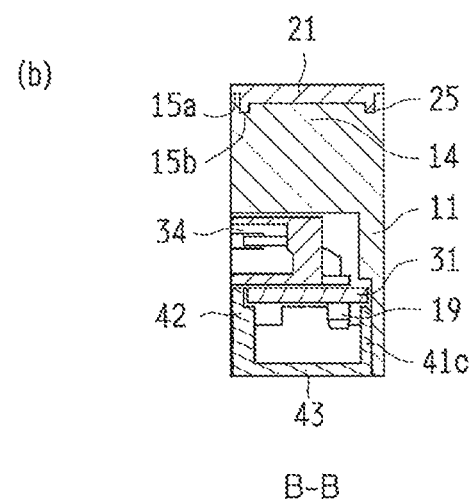

FIG. 6 is a cross-sectional view of the limited reflection type sensor 100, where FIG. 6(a) is a schematic cross-sectional view at the position A-A in FIG. 1, and FIG. 6(b) is a schematic cross-sectional view at the position B-B in FIG. 1. In the limited reflection type sensor 100 of the embodiment, the lens part 20 is mounted to the opening 15 in the casing 10, the substrate 30 is accommodated inside the casing 10, the connector 34 is exposed from the side surface opening 11c, and the cover 40 is mounted to the bottom surface opening 11b of the casing 10.

The assembly state shown in FIGS. 6(a) and 6(b) will be briefly described. The partition plate 14 is inserted into the separation groove 26, and its upper end abuts against the rear surface of the light incident/exit part 21. The upper end of the lens abutting portion 15a abuts against the rear surface of the light incident/exit part 21. The sealing projection 25 is fitted into the sealing groove 15b. The side surface covering part 24 is guided and fitted into the guide groove 13b. The latching pawl 13a is fitted into the latching opening 24a.

The connector 34 is accommodated in the connector accommodation 16 and exposed from the side surface opening 11c. The substrate aligning part 19 is inserted into the aligning hole 31a. The light emitting unit 32 is accommodated in the light emitting accommodation 17. The light receiving unit 33 is accommodated in the light receiving accommodation 18. The upper surface of the mounting substrate 31 abuts against the division wall 11d.

The latching pawl 41a is fitted into the latching opening 11a. The upper ends of the substrate supports 41b and 41c abut against the rear surface of the mounting substrate 31. The upper end of the opening covering part 42 abuts against the lower surface of the connector 34.

Therefore, the upward movement of the lens part 20 is regulated by the latching pawl 13a and the latching opening 24a, and the downward movement of the lens part 20 is regulated by the upper end of the partition plate 14, the lens abutting portion 15a, and the rear surface of the light incident/exit part 21, and hence the vertical movement is regulated and the lens part 20 is aligned. The movement of the lens part 20 to the depth direction in the figure is regulated by the fitting of the guide groove 13b and the side surface covering part 24 and the abutting of the sealing groove 15b and the sealing projection 25, whereby the lens part 20 is aligned. Furthermore, the movement of the lens part 20 to the lateral direction in the figure is regulated by the insertion of the partition plate 14 into the separation groove 26 and the sandwiching of the casing 10 by the two side surface covering parts 24, whereby the lens part 20 is aligned.

These alignments are individually effective because of each movement regulation, and the effect can be further enhanced by combining a plurality of components. Accordingly, with simply mounting the lens part 20 to the casing 10, the movement of the lens part 20 in the three-dimensional direction is regulated with respect to the casing 10. Hence, the exit light lens 22 and the reflected light lens 23, which are molded integrally with the light incident/exit part 21, are easily and accurately aligned with respect to the light emitting unit 32 and the light receiving unit 33 accommodated inside the casing 10.

By providing the latching pawl 13a on the side surface of the casing body 11, the latching portion 13 of the casing 10 elastically deforms when the lens part 20 is mounted, and the lens part 20 does not elastically deform. This allows the risk of defocus and damage due to deformation of the lens part 20 to be reduced, and the lens part 20 to be easily mounted.

In the examples shown in FIGS. 1 to 5, the latching opening 24a is formed at a position close to the light incident/exit part 21 which is upper side with respect to the half of the side surface covering part 24. As a result, the elastic piece on which the latching pawl 13a is formed can be lengthened to facilitate elastic deformation when the lens portion 20 is mounted, and the side surface covering part 24 can cover the entire elastic piece to eliminate a gap. Therefore, it is possible to easily attach the lens part 20 and improve the dust-resistant property.

The upward movement of the mounting substrate 31 is regulated because the upper surface of the mounting substrate 31 abuts against the division wall 11d, and the downward movement of the mounting substrate 31 is regulated because the substrate supports 41b and 41c abut against the rear surface of the mounting substrate 31, and hence the vertical movement is regulated and the mounting substrate 31 is aligned. The substrate aligning part 19 is inserted into the aligning hole 31a of the mounting substrate 31, whereby the horizontal movement is regulated and the mounting substrate 31 is aligned.

These alignments are individually effective because of each movement regulation, and the effect can be further enhanced by combining a plurality of components. Accordingly, with simply inserting the substrate 30 into the casing 10 and mounting the cover 40, the movement of the substrate 30 in the three-dimensional direction is regulated with respect to the casing 10. Hence, the light emitting unit 32 and the light receiving unit 33 mounted on the mounting substrate 31 are easily and accurately aligned in the light emitting accommodation 17 and the light receiving accommodation 18, respectively. The opening covering part 42 is extended to the vicinity of the lower surface of the connector 34, and hence the side surface opening 11c is covered with the connector 34 and the opening covering part 42, whereby it is possible to suppress entry of dust and dirt to the inside and it is possible to enhance dust-resistant property.

As described above, the limited reflection type sensor 100 of the embodiment can perform accurate alignment when the lens part 20 is mounted on the casing 10, and can enhance the dust-resistant property. Due to this, assembling the lens part 20 having different focus position will facilitate change of the sensing range of the limited reflection type sensor 100 to one corresponding to the lens part 20.

The side surface covering part 24 extends from the light incident/exit part 21 and is integrally formed, and constitutes the outermost portion of the lens part 20. Accordingly, it is possible to easily confirm, from the outside of the limited reflection type sensor 100, whether or not the side surface covering part 24 is fitted into the guide groove 13b and whether or not the latching pawl 13a is fitted into the latching opening 24a. Due to this, it is possible to easily confirm, after the lens part 20 is mounted, whether or not the exit light lens 22 and the reflected light lens 23 are accurately aligned.

Second Embodiment

Figure 7:
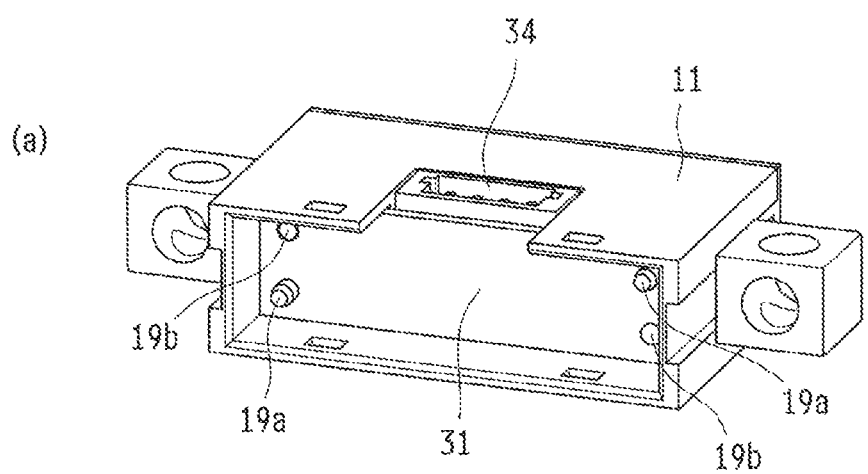
FIGS. 7(a) and 7(b) are views schematically showing a fixing structure of a mounting substrate 31 according to a second embodiment, where
Figure 7:
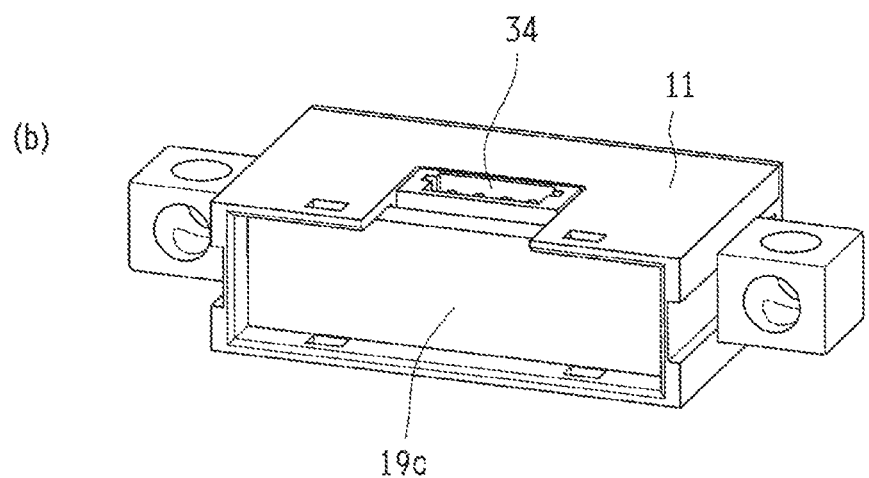

Next, the second embodiment of the present invention will be described with reference to the drawings. The contents overlapping those of the first embodiment are omitted. FIGS. 7(a) and 7(b) are views schematically showing a fixing structure of a mounting substrate 31 according to the second embodiment, where FIG. 7(a) shows an example using a press-fitting pin 19a and a swaging pin 19b, and FIG. 7(b) shows an example in which a bonding agent 19c is applied to the rear surface of the mounting substrate 31.

In the example shown in FIG. 7(a), a plurality of aligning holes 31a are formed on the mounting substrate 31, and the press-fitting pin 19a and the swaging pin 19b formed in the division wall 11d are inserted into the aligning holes 31a.

The press-fitting pin 19a is a pin having a slightly tapered shape, and its tip is smaller in diameter than the aligning hole 31a, and its base is larger in diameter than the aligning hole 31a. When the press-fitting pin 19a is aligned and inserted into the aligning hole 31a, if the mounting substrate 31 is strongly pressed, the press-fitting pin 19a made of resin is press-fitted with slight deformation. Due to this, alignment and fixing are simultaneously performed by press-fitting the press-fitting pin 19a into the aligning hole 31a.

The swaging pin 19b is a pin having a shape with a diameter smaller than the aligning hole 31a. After the swaging pin 19b is aligned and inserted into the aligning hole 31a, the head of the swaging pin 19b is crushed and deformed. Due to this, alignment and fixing are simultaneously performed by swaging the swaging pin 19b into the aligning hole 31a.

In the example shown in FIG. 7(b), after the mounting substrate 31 is inserted into a bottom surface opening 11b, the bonding agent 19c is applied to the entire rear surface side of the mounting substrate 31. The bonding agent 19c fills and seals a gap between the mounting substrate 31 and the inner surface of a casing body 11, and fixes the mounting substrate 31 inside the casing body 11.

As a fixing structure of the mounting substrate 31, for example, a latching pawl may be formed in the casing body 11, and the latching pawl may be engaged with the mounting substrate 31. Furthermore, the above-described sandwiching by the cover 40, the press-fitting pin 19a, the swaging pin 19b, the application of the bonding agent 19c, and the latching by the latching pawl may be appropriately combined.

Third Embodiment

Figure 8:
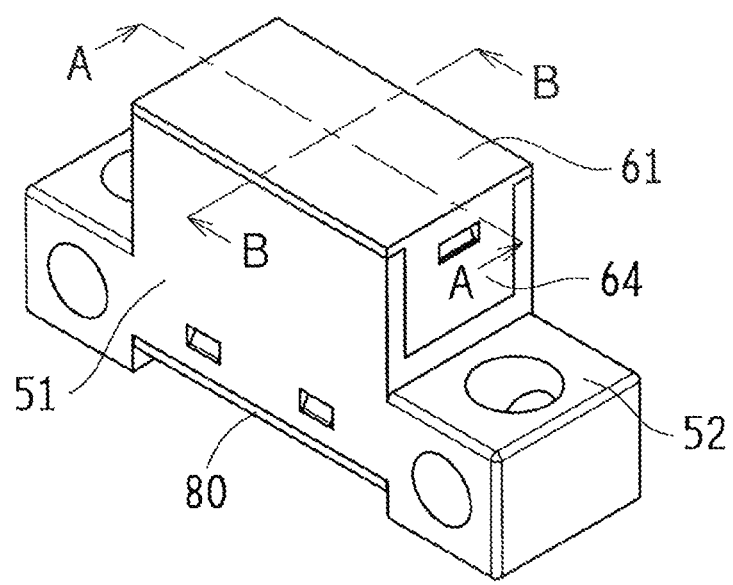
FIG. 8 is a schematic perspective view showing a configuration of a limited reflection type sensor 200 according to the second embodiment.
Figure 9:
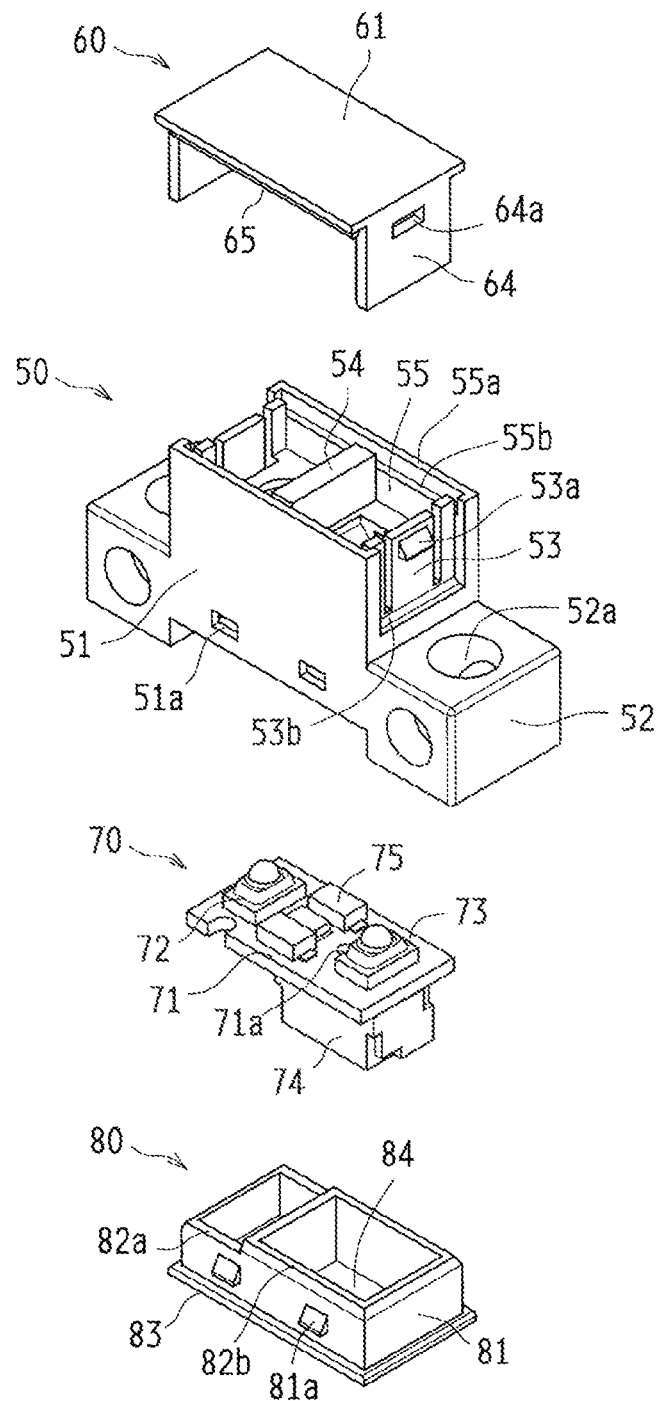
FIG. 9 is an exploded perspective view schematically showing the configuration of the limited reflection type sensor 200.

Next, a third embodiment of the present invention will be described with reference to the drawings. The contents overlapping those of the first embodiment are omitted. FIG. 8 is a schematic perspective view showing the configuration of the limited reflection type sensor 200 according to the second embodiment. FIG. 9 is an exploded perspective view schematically showing the configuration of the limited reflection type sensor 200. As shown in FIGS. 8 and 9, the limited reflection type sensor 200 includes a casing 50, a lens part 60, a substrate 70, and a cover 80.

The casing 50 includes a casing body 51, an attachment portion 52, a latching portion 53, a partition plate 54, and an opening 55. In the casing body 51, a latching opening 51a is formed in the vicinity of the bottom surface of the side surface, a bottom opening 51b is formed on the bottom surface, and a side surface opening 51c is formed in the longitudinal side surface each as an opening. The latching portion 53 uses a snap-fit structure in which a part of the side surface is cut out as an elastic piece and a latching pawl 53a is formed at the tip thereof. In the latching portion 53, a guide groove 53b having the same width and length as those of a side surface covering part 64 is formed in the short side surface of the casing body 51. A lens abutting portion 55a and a sealing groove 55b are formed in the opening 55.

The lens part 60 includes the light incident/exit part 61, an exit light lens 62, a reflected light lens 63, the side surface covering part 64, and the sealing projection 65. The exit light lens 62 and the reflected light lens 63 are formed at positions separated from each other by a separation groove 66, and the lens part 60 is molded integrally with the light incident/exit part 61. A latching opening 64a is formed in the side surface covering part 64 at a position corresponding to the latching portion 53.

The substrate 70 is a member in which a light emitting unit 72 and a light receiving unit 73 are mounted on one surface of a mounting substrate 71, and a connector 74 is mounted on the other surface thereof. An aligning hole 71a, which is a through hole, is formed on the mounting substrate 71 at a predetermined position.

The cover 80 has a cover wall 81, a latching pawl 81a, a cover wall upper end 82a, a substrate abutting portion 82b, a bottom surface 83, and a connector opening 84. The cover wall upper end 82a is an upper end of a region of the cover wall 81 that is formed low. The substrate abutting portion 82b is an upper end of a region of the cover wall 81 that is formed high, and is formed so as to surround the outer periphery of the connector 74. The connector opening 84 is an opening formed on the bottom surface 83 at a position corresponding to the connector 74, and is formed inside the substrate abutting portion 82b, thereby corresponding to the fourth opening in the present invention. In the examples shown in FIGS. 8 and 9, the connector 74 is mounted downward from the rear surface of the mounting substrate 71, and is exposed from the connector opening 84 to the outside of the casing 50.

Figure 10:
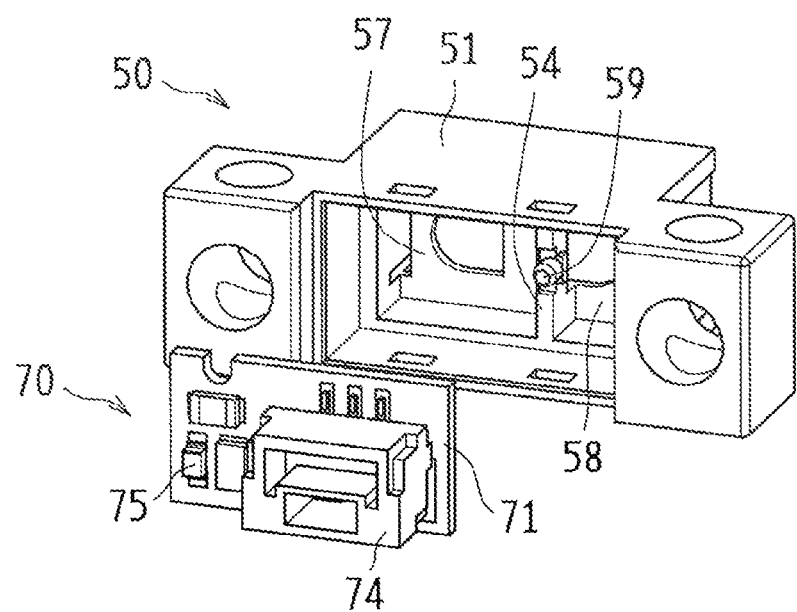
FIG. 10 is a schematic perspective view for explaining assembly of a casing 50 and a substrate 70.

Next, assembly of the limited reflection type sensor 200 will be described with reference to FIGS. 10 to 12. FIG. 10 is a schematic perspective view for explaining assembly of the casing 50 and the substrate 70. As shown in FIG. 10, the partition plate 54 is formed inside the casing 50. The partition plate 54 forms a light emitting accommodation 57 and a light receiving accommodation 58 inside the casing 50. On the partition plate 54, a downward projection is formed as a substrate aligning part 59. The substrate aligning part 59 is a projection formed at a position corresponding to the aligning hole 71a formed on the mounting substrate 71.

As shown in FIG. 10, the substrate aligning part 59 and the aligning hole 71a are aligned, and the substrate 70 is inserted into the bottom surface opening 51b. Due to this, the light emitting unit 72 is aligned at a predetermined position of the light emitting accommodation 57, and the light receiving unit 73 is aligned at a predetermined position of the light receiving accommodation 58.

Figure 11:
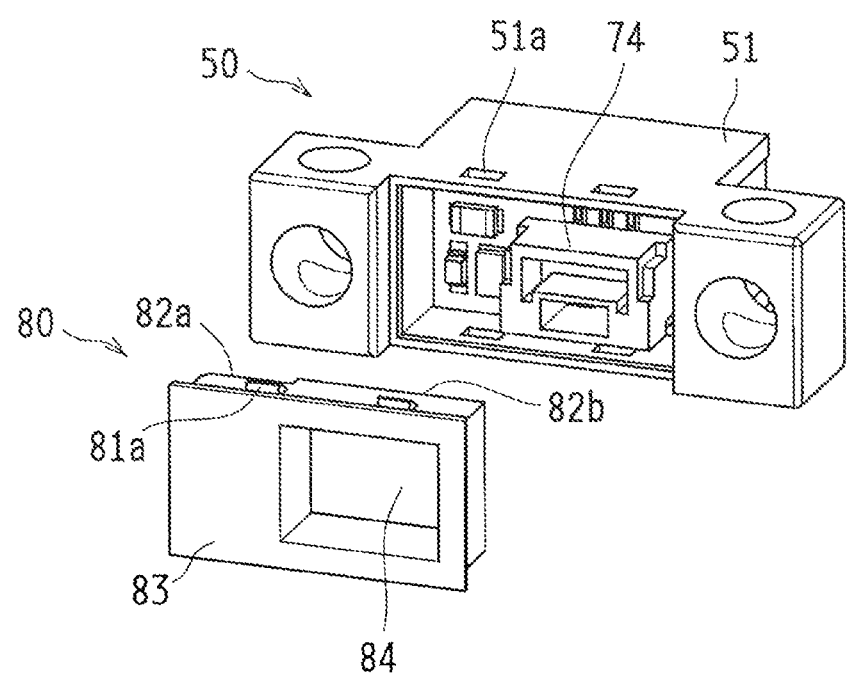
FIG. 11 is a schematic perspective view for explaining assembly of the casing 50 and a cover 80.

FIG. 11 is a schematic perspective view for explaining assembly of the casing 50 and the cover 80. As shown in FIG. 11, a substantially flat plate bottom surface 83 is formed at the bottom of the cover 80, and the cover wall 81 is provided along the outer edge of the bottom surface 83. When the cover 80 is inserted into the bottom surface opening 51b of the casing 50, the outer periphery of the cover wall 81 is fitted into the inner wall of the casing body 51, and the latching pawl 81a is fitted into the latching opening 51a, whereby the cover 80 is aligned and fixed. At this time, the substrate abutting portion 82b abuts against the rear surface side of the mounting substrate 71. Due to this, the substrate 70 aligned inside the casing 50 is sandwiched between the cover 80 and the casing 50, and is aligned and fixed.

Figure 12:
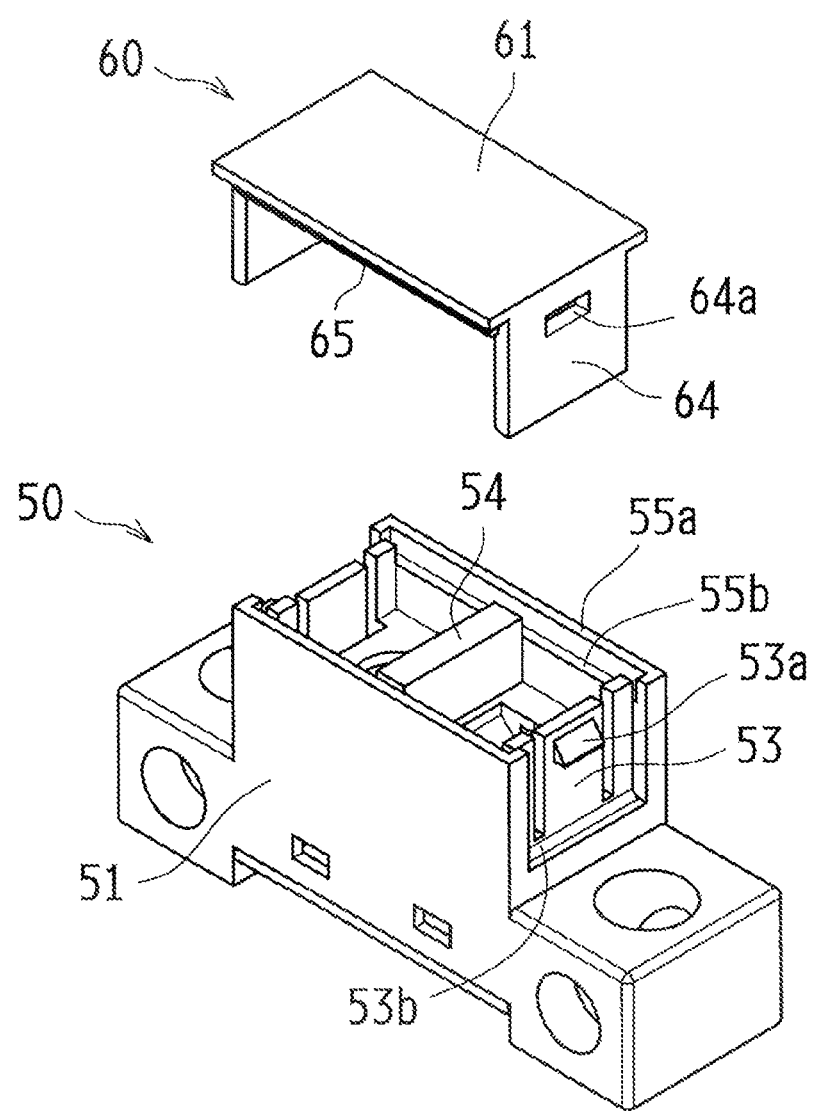
FIG. 12 is a schematic perspective view for explaining assembly of the casing 50 and a lens part 60.

FIG. 12 is a schematic perspective view for explaining assembly of the casing 50 and the lens part 60. As shown in FIG. 12, the side surface covering part 64 of the lens part 60 is aligned to the latching portion 53 of the casing 50, and the opening 55 is covered with the light incident/exit part 61 of the lens part 60. At this time, at the same time, the partition plate 54 is inserted into the separation groove 66 and abuts against the rear surface of the light incident/exit part 61, and the sealing projection 65 is inserted into the sealing groove 55b. The side surface covering part 64 is fitted into the guide groove 53b, and the latching pawl 53a is fitted into the latching opening 64a, whereby the lens part 60 is aligned and fixed to the casing 50.

Figure 13:
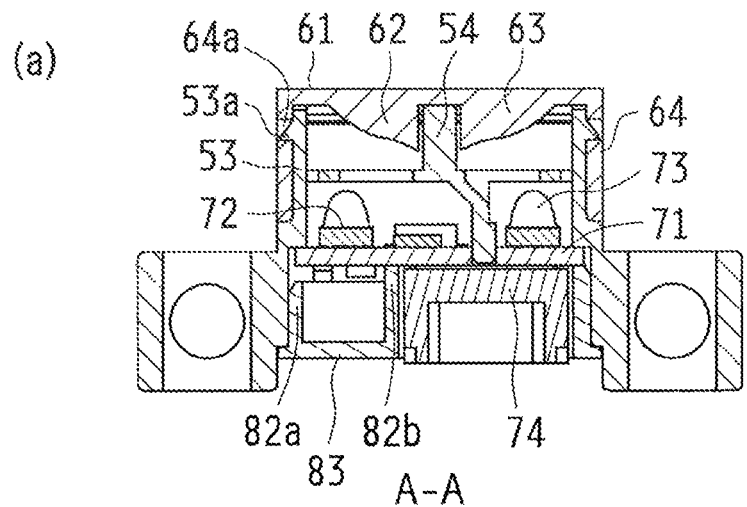
FIGS. 13(a) and 13(b) are cross-sectional views of the limited reflection type sensor 200, where
Figure 13:
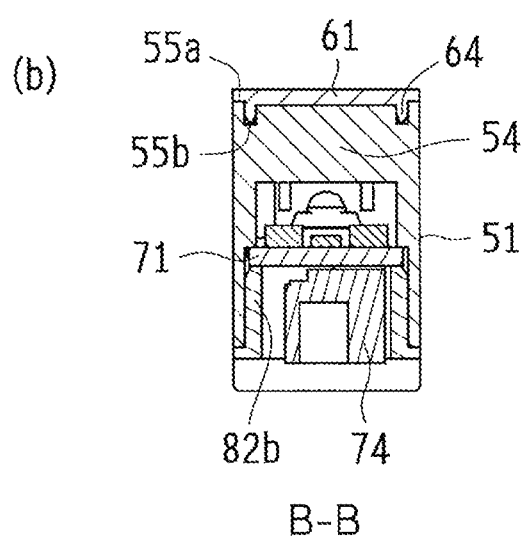

FIGS. 13(a) and 13(b) are cross-sectional views of the limited reflection type sensor 200, where FIG. 13(a) is a schematic cross-sectional view at the position A-A in FIG. 8, and FIG. 13(b) is a schematic cross-sectional view at the position B-B in FIG. 8. In the limited reflection type sensor 200 of the embodiment, the lens part 60 is mounted to the opening 55 in the casing 50, the substrate 70 is accommodated inside the casing 50, and the cover 80 is mounted to the bottom surface opening 51b of the casing 50. The connector 74 is exposed downward from the connector opening 84.

The limited reflection type sensor 200 of the embodiment is different from the first embodiment in that the connector 74 is mounted on the rear surface side of the mounting substrate 71 and is exposed downward in the figure from the connector opening 84 provided on the cover 80. Since the connector 74 is not arranged between the light emitting unit 72 and the light receiving unit 73, the area of the mounting substrate 71 is reduced. That eliminates the necessity for providing a space where the connector 74 is accommodated between the light emitting accommodation 57 and the light receiving accommodation 58, and the casing 50 is also downsized. Due to the downsizing of the casing body 51, the attachment portion 52 is provided below the casing body 51 in a protruding manner relative to the cover 80.

As shown in FIGS. 13(a) and 13(b), with simply mounting the lens part 60 to the casing 50, the movement of the lens part 60 in the three-dimensional direction is regulated with respect to the casing 50. Hence, the exit light lens 62 and the reflected light lens 63, which are molded integrally with the light incident/exit part 61, are easily and accurately aligned with respect to the light emitting unit 72 and the light receiving unit 73 accommodated inside the casing 50.

The upward movement of the mounting substrate 71 is regulated because the upper surface of the mounting substrate 71 abuts against the partition plate 54, and the downward movement of the mounting substrate 71 is regulated because the substrate abutting portion 82b abuts against the rear surface of the mounting substrate 71, and hence the vertical movement is regulated and the mounting substrate 71 is aligned. Due to this, with simply inserting the substrate 70 into the casing 50 and mounting the cover 80, the movement of the substrate 70 with respect to the casing 50 is regulated. Hence, the light emitting unit 72 and the light receiving unit 73 mounted on the mounting substrate 71 are easily and accurately aligned in the light emitting accommodation 57 and the light receiving accommodation 58, respectively.

In the limited reflection type sensor 200 of the embodiment, the substrate abutting portion 82b surrounds the circumference of the connector 74 and abuts against the rear surface side of the mounting substrate 71. Due to this, the substrate abutting portion 82b covers the circumference of the connector 74, whereby it is possible to suppress entry of dust and dirt to the inside and it is possible to enhance dust-resistant property.

As described above, also the limited reflection type sensor 200 of the embodiment can perform accurate alignment when the lens part 60 is mounted on the casing 50, and can enhance the dust-resistant property.

It is to be noted that the embodiments disclosed herein are exemplary in all respects and are not a basis for limited construe. Accordingly, the technical scope of the present invention should not be construed only by the above-described embodiments, but should be defined based on the claims. The meaning equivalent to the scope of claims and all modifications within the scope are included.

DESCRIPTION OF SYMBOLS 10, 50 casing
20, 60 lens part
30, 70 substrate
40, 80 cover
100, 200 limited reflection type sensor
11, 51 casing body
11a, 51a latching opening
11b, 51b bottom surface opening
11c, 51c side surface opening
11d division wall
12, 52 attachment portion
12a attachment hole
13, 53 latching portion
13a, 53a latching pawl
13b, 53b guide groove
14, 54 partition plate
15, 55 opening
15a, 55a lens abutting portion
15b, 55b sealing groove
16 connector accommodation
17, 57 light emitting accommodation
18, 58 light receiving accommodation
19, 59 substrate aligning part
19a press-fitting pin
19b swaging pin
19c bonding agent
21, 61 light incident/exit part
22, 62 exit light lens
23, 63 reflected light lens
24, 64 side surface covering part
24a, 64a latching opening
25, 65 sealing projection
26, 66 separation groove
31, 71 mounting substrate
31a, 71a aligning hole
32, 72 light emitting unit
33, 73 light receiving unit
34, 74 connector
41, 81 cover wall
41a, 81a latching pawl
41b substrate support
42 opening covering part
43, 83 bottom surface
82a cover wall upper end
82b substrate abutting portion
84 connector opening

The invention claimed is:

1. A limited reflection type sensor which irradiates exit light from a light emitting unit toward an object sensing region through an exit light lens and receives, at a light receiving unit, reflected light from an object existing in the object sensing region through a reflected light lens, the limited reflection type sensor comprising:

a casing comprising a latching portion formed on a side surface and a first opening facing the object sensing region, the casing accommodating the light emitting unit and the light receiving unit; and a lens part comprising a light incident/exit part formed integrally with the exit light lens and the reflected light lens, and a side surface covering part in which an end of the light incident/exit part is extended along the side surface, wherein the lens part covers the first opening with the light incident/exit part, and the side surface covering part is latched by the latching portion, the side surface covering part extends from the end of the light incident/exit part, is formed as a single piece, and forms the outermost part of the lens part, and the casing comprises a guide groove that guides the side covering portion, the guide groove is arranged on the side surface of the casing, and the guide groove has approximately the same width and length as the side covering portion.

2. The limited reflection type sensor according to claim 1, wherein the latching portion has a snap-fit structure in which a latching pawl is formed at a tip of an elastic piece, and the latching pawl is fitted into a latching opening formed on the side surface covering part.

3. The limited reflection type sensor according to claim 1, wherein the latching portion latches the side surface covering part at a position closer to the light incident/exit part relative to half in an extension direction of the side surface covering part.

4. The limited reflection type sensor according to claim 1, wherein the first opening comprises a sealing groove inside, the sealing groove being formed along a longitudinal direction of the casing, the lens part comprises a sealing projection having a shape corresponding to the sealing groove formed on the first opening side, and the sealing groove and the sealing projection abut against each other.

5. The limited reflection type sensor according to claim 1, wherein the casing comprises a second opening on a side opposite to the first opening, and the limited reflection type sensor further comprises:

a mounting substrate accommodated in the casing with the light emitting unit and the light receiving unit mounted thereon; and a cover latched to the casing and covering the second opening.

6. The limited reflection type sensor according to claim 5, wherein a connector for external electrical connection is mounted on the mounting substrate, and the connector is exposed from a third opening formed on another side surface of the casing.

7. The limited reflection type sensor according to claim 5, wherein a connector for external electrical connection is mounted on the mounting substrate, and the connector is exposed from a fourth opening formed on a bottom surface of the cover.

8. The limited reflection type sensor according to claim 2, wherein a guide groove guiding the side surface covering part is formed on the side surface.

9. The limited reflection type sensor according to claim 2, wherein the latching portion latches the side surface covering part at a position closer to the light incident/exit part relative to half in an extension direction of the side surface covering part.

10. The limited reflection type sensor according to claim 2, wherein the first opening comprises a sealing groove inside, the sealing groove being formed along a longitudinal direction of the casing, the lens part comprises a sealing projection having a shape corresponding to the sealing groove formed on the first opening side, and the sealing groove and the sealing projection abut against each other.

11. The limited reflection type sensor according to claim 2, wherein the casing comprises a second opening on a side opposite to the first opening, and the limited reflection type sensor further comprises:

a mounting substrate accommodated in the casing with the light emitting unit and the light receiving unit mounted thereon; and a cover latched to the casing and covering the second opening.

12. The limited reflection type sensor according to claim 11, wherein a connector for external electrical connection is mounted on the mounting substrate, and the connector is exposed from a third opening formed on another side surface of the casing.

13. The limited reflection type sensor according to claim 11, wherein a connector for external electrical connection is mounted on the mounting substrate, and the connector is exposed from a fourth opening formed on a bottom surface of the cover.

14. The limited reflection type sensor according to claim 1, wherein the latching portion latches the side surface covering part at a position closer to the light incident/exit part relative to half in an extension direction of the side surface covering part.

15. The limited reflection type sensor according to claim 1, wherein the first opening comprises a sealing groove inside, the sealing groove being formed along a longitudinal direction of the casing, the lens part comprises a sealing projection having a shape corresponding to the sealing groove formed on the first opening side, and the sealing groove and the sealing projection abut against each other.

16. The limited reflection type sensor according to claim 1, wherein the casing comprises a second opening on a side opposite to the first opening, and the limited reflection type sensor further comprises:

a mounting substrate accommodated in the casing with the light emitting unit and the light receiving unit mounted thereon; and a cover latched to the casing and covering the second opening.

17. The limited reflection type sensor according to claim 16, wherein a connector for external electrical connection is mounted on the mounting substrate, and the connector is exposed from a third opening formed on another side surface of the casing.

18. The limited reflection type sensor according to claim 16, wherein
a connector for external electrical connection is mounted on the mounting substrate, and
the connector is exposed from a fourth opening formed on a bottom surface of the cover.

19. The limited reflection type sensor according to claim 1, wherein
the light incident/exit part is a substantially flat portion that forms the upper portion of the lens portion.

* * * * *